(12) United States Patent
Takahashi (10) Patent No.: US 10,338,424 B2
(45) Date of Patent: Jul. 2, 2019

(54) CURVED DISPLAY APPARATUS (71) Applicant: Sakai Display Products Corporation, Osaka (JP)

(72) Inventor: Yoshihisa Takahashi, Osaka (JP)

(73) Assignee: Sakai Display Products Corporation, Osaka (JP)

(*) Notice: Subject to any disclaimer, the term of this patent is extended or adjusted under 35 U.S.C. 154(b) by 0 days.

(21) Appl. No.: 15/862,532

(22) Filed: Jan. 4, 2018

(65) Prior Publication Data
US 2018/0129096 A1 May 10, 2018

Related U.S. Application Data (63) Continuation-in-part of application No. PCT/JP2015/069447, filed on Jul. 6, 2015.

(51) Int. Cl.
G02F 1/1333 (2006.01)
G09F 9/30 (2006.01)
(Continued)

(52) U.S. Cl.
CPC ..... *G02F 1/133308* (2013.01); *G02B 6/0045* (2013.01); *G02F 1/133305* (2013.01);
(Continued)

(58) Field of Classification Search
CPC combination set(s) only.
See application file for complete search history.

(56) References Cited

U.S. PATENT DOCUMENTS

2003/0020702 A1  1/2003  Matsuyama
2005/0211990 A1  9/2005  Lee et al.
(Continued)

FOREIGN PATENT DOCUMENTS

JP   H02247618 A   10/1990
JP   2003044004 A   2/2003
(Continued)

OTHER PUBLICATIONS

English Translation of the International Search Report, PCT International Application No. PCT/JP2015/069447, Japan Patent Office, Tokyo, Japan. dated Aug. 11, 2015.

*Primary Examiner* — Shaheda A Abdin
(74) *Attorney, Agent, or Firm* — Marsh Fischmann & Breyfogle LLP (57) ABSTRACT There is provided a curved display apparatus. The curved display apparatus with transistors of respective pixels arranged in a matrix form on a bendable display screen comprises a gate drive circuit to sequentially provide a gate signal for simultaneously turning on each of a plurality of transistors aligned in the column direction of the matrix to a plurality of gate lines and a source drive circuit to provide a pixel data signal to each of a plurality of source lines, the each pixel data signal representing a gradation of a pixel for each of a plurality of transistors aligned in the row direction of the matrix. The source drive circuit is provided on a first bendable edge of the display screen, the first bendable edge having a first curvature, and the gate drive circuit is provided on a second bendable edge of the display screen, the second bendable edge having a second curvature larger than the first curvature.

14 Claims, 7 Drawing Sheets (51) Int. Cl.
    *F21V 8/00*      (2006.01)
    *H01L 27/12*     (2006.01)
    *G06F 1/16*      (2006.01)
    *H01L 27/32*     (2006.01)
    *H01L 51/00*     (2006.01)
    *G02B 6/24*      (2006.01)

(52) U.S. Cl.
    CPC .............. *G09F 9/30* (2013.01); *H01L 27/124* (2013.01); *H01L 27/1218* (2013.01); *H01L 27/1255* (2013.01); *G02B 6/0011* (2013.01); *G02B 6/24* (2013.01); *G02F 2001/13332* (2013.01); *G02F 2001/133314* (2013.01); *G06F 1/16* (2013.01); *G09G 2380/02* (2013.01); *H01L 27/3244* (2013.01); *H01L 51/0097* (2013.01); *H01L 2251/5338* (2013.01)

(56)          References Cited

U.S. PATENT DOCUMENTS

| 2006/0098153 | A1* | 5/2006  | Slikkerveer ....... G02F 1/133305 349/187 |
| 2007/0072439 | A1  | 3/2007  | Akimoto et al. |
| 2008/0013030 | A1  | 1/2008  | Fujita |
| 2008/0136989 | A1* | 6/2008  | Higaki .................... H01L 27/12 349/46 |
| 2010/0277443 | A1* | 11/2010 | Yamazaki ............. G06F 1/1616 345/204 |
| 2011/0096262 | A1* | 4/2011  | Kikuchi .................... G09F 9/35 349/58 |
| 2011/0134087 | A1* | 6/2011  | Moriwaki ................ G09G 3/20 345/204 |

FOREIGN PATENT DOCUMENTS

| JP | 2005284252  | A  |   | 10/2005 |
| JP | 2005338179  | A  |   | 12/2005 |
| JP | 2007123861  | A  |   | 5/2007  |
| JP | 2008020836  | A  |   | 1/2008  |
| JP | 2009180904  | A  |   | 8/2009  |
| JP | 2010282181  | A  |   | 12/2010 |
| JP | 2012159633  | A  |   | 8/2012  |
| JP | 2013134295  | A  |   | 7/2013  |
| JP | 2014197181  | A  |   | 10/2014 |
| JP | 2012159633  |    | * | 8/2018  |
| WO | 2014136856  | A1 |   | 9/2014  |

* cited by examiner

DISPLAY LIGHT

CURVED DISPLAY APPARATUS

CROSS-REFERENCE TO RELATED APPLICATION

This is a continuation-in-part of PCT international application No. PCT/JP2015/069447 filed on Jul. 6, 2015, incorporated herein by reference.

BACKGROUND OF THE INVENTION

The present disclosure relates to a curved display apparatus with a bendable display screen.

In recent years, a display apparatus having a bendable display screen (flexible display) starts to become popular as, for example, a liquid crystal display apparatus, an organic EL display apparatus, an electrophoresis display apparatus.

For example, a bendable active matrix type liquid crystal display apparatus includes a liquid crystal panel including two bendable, transparent substrates with a liquid crystal layer therebetween, and the one of two transparent substrates includes a plurality of gate (bus) lines (scanning signal lines) and a plurality of source (bus) lines (image signal line) which are arranged in a grid pattern.

At each intersection between a plurality of gate lines (for example, a row direction of the matrix) and a plurality of source lines (for example, a column direction of the matrix), pixels are provided in the corresponding matrix form.

Each pixel includes, for example, a thin film transistor (TFT) in which a gate terminal is connected to a gate line passing the corresponding intersection and a source terminal is connected to a source line passing that intersection, and a pixel capacitor for storing a pixel value. Further, the other transparent substrate of the two transparent substrates includes a common electrode which is a counter electrode provided commonly to the above-mentioned pixels.

The active matrix type, bendable liquid crystal display apparatus further includes a gate drive circuit that is connected to the plurality of gate lines to turn on the gates each connected to the same gate line simultaneously, by each gate line sequentially in cycle, a gate drive signal output circuit to output a drive signal for driving the gate drive circuit, and a source drive circuit and a source signal circuit that are connected to the plurality of source lines to provide a pixel data signal to the sources each connected to the same source line simultaneously, by each source line sequentially in cycle.

An image signal containing a pixel data is transmitted by the source line, however, each source line cannot transmit an image signal containing a pixel data of pixels in plural rows. Therefore, the image signal is sequentially written row by row in the pixel capacitor of the pixels arranged in the matrix form. Thus, the gate drive circuit includes a multi-stage shift register to sequentially select one gate line from among many at a prescribed interval.

Further, recently a gate driver of a liquid crystal display apparatus is formed monolithically. A gate driver was often mounted as an IC (integrated circuit) chip on the periphery of the substrate constituting a liquid crystal panel. However, recently it becomes more common that the gate driver is formed directly on a substrate. Such gate drivers are normally called, for example, "monolithic gate drivers". Further, panels provided with the monolithic gate driver are called, for example, "gate driver monolithic panels".

JP 2014-197181 A discloses a display apparatus including, over a flexible substrate, a display portion, a plurality of connection terminals to which a signal from an outside can be input, and a plurality of wirings, wherein one of the plurality of wirings electrically connects one of the plurality of connection terminals to the display portion. The one of the plurality of wirings includes a first portion including a plurality of separate lines and a second portion in which the plurality of lines converge, and signals from an outside are put together into one to be input.

However, realizing an increasement of sizes and high definition, which increases the number of signals, of this display apparatus is difficult because it is necessary to route the signals from outside to the entire substrate from one location.

The above-mentioned bendable display apparatus has a problem of the occurrence of a defective mounting such as peeling of a source drive circuit mounted on an bendable edge, for example, the edge along the direction of row in the matrix form, which results in a decrease in production yield and reliability.

SUMMARY OF THE INVENTION

The present invention has been made in view of such circumstances as mentioned above, and an object of the present invention is to provide a curved display apparatus hardly causing a defective mounting such as peeling of a source drive circuit, thereby preventing deteriorations in a production yield and reliability.

A curved display apparatus with transistors of respective pixels arranged in a matrix form on a bendable display screen according to one embodiment of the present invention comprises a plurality of gate lines arranged side by side in a row direction of the matrix and each connected to each gate of a plurality of transistors aligned in a column direction of the matrix, a plurality of source lines arranged side by side in the column direction of the matrix and each connected to each source of a plurality of transistors aligned in the row direction of the matrix, a gate drive circuit to sequentially provide a gate signal for simultaneously turning on each of the plurality of transistors aligned in the column direction of the matrix to the plurality of gate lines, and a source drive circuit to provide a pixel data signal to each of the plurality of source lines, the each pixel data signal representing a gradation of a pixel for each of the plurality of transistors aligned in the row direction of the matrix, wherein the source drive circuit is provided on a first bendable edge of the display screen, the first bendable edge having a first curvature, and the gate drive circuit is provided on a second bendable edge of the display screen, the second bendable edge having a second curvature larger than the first curvature.

In another embodiment of the present invention, the curved display device further comprises a gate drive signal output circuit to output a drive signal for driving the gate drive circuit to the gate drive circuit, and a source signal circuit to provide the pixel data signal to the source drive circuit, wherein the gate drive signal output circuit and the source signal circuit are provided close to the first bendable edge having the first curvature.

In yet another embodiment of the present invention, the gate drive circuit is a shift register to output each data stored in respective bits to each gate line, and the drive signal is a shift register drive signal for driving the shift register.

In yet another embodiment of the present invention, the curved display apparatus is configured so that the source signal circuit and the gate drive signal output circuit are integrated into a source signal and gate drive signal output circuit, and the drive signal output from the source signal and gate drive signal output circuit is provided to the gate drive circuit through the source drive circuit.

In yet another embodiment of the present invention, the curved display screen is formed so as to be a part of a side of a cylindrical body, the side being parallel with a height direction of the cylindrical body, and the first bendable edge of the display screen with the first curvature extends along the height direction of the cylindrical body, and the second bendable edge of the display screen with the second curvature extends along a circumferential direction of the cylindrical body.

In yet another embodiment of the present invention, the source drive circuits are provided on the first bendable edge with the first curvature and a third edge opposed to the first bendable edge, and the gate drive signal output circuit and the source signal circuit are provided close to the first bendable edge with the first curvature and the third edge opposed to the first bendable edge.

In yet another embodiment of the present invention, wherein the gate drive circuits are provided on the second bendable edge with the second curvature and a fourth edge opposed to the second bendable edge, and each of the gate drive circuits provided on the second bendable edge and the fourth edge opposed to the second bendable edge is configured so that to which the drive signal output from the gate drive signal output circuit is provided.

In yet another embodiment of the present invention, a portion of the display screen capable of being bent with the second curvature is formed thinner than a portion of the display screen capable of being bent with the first curvature.

According to the exemplary embodiments of the present invention, a curved display apparatus can be provided, in which a defective mounting such as peeling of a source drive circuit is hardly caused and deteriorations in production yield and reliability are prevented.

DETAILED DESCRIPTION

The invention will be further described below in terms of exemplary embodiments and particularly in terms of drawings showing some embodiments.

Embodiment 1

Figure 1:
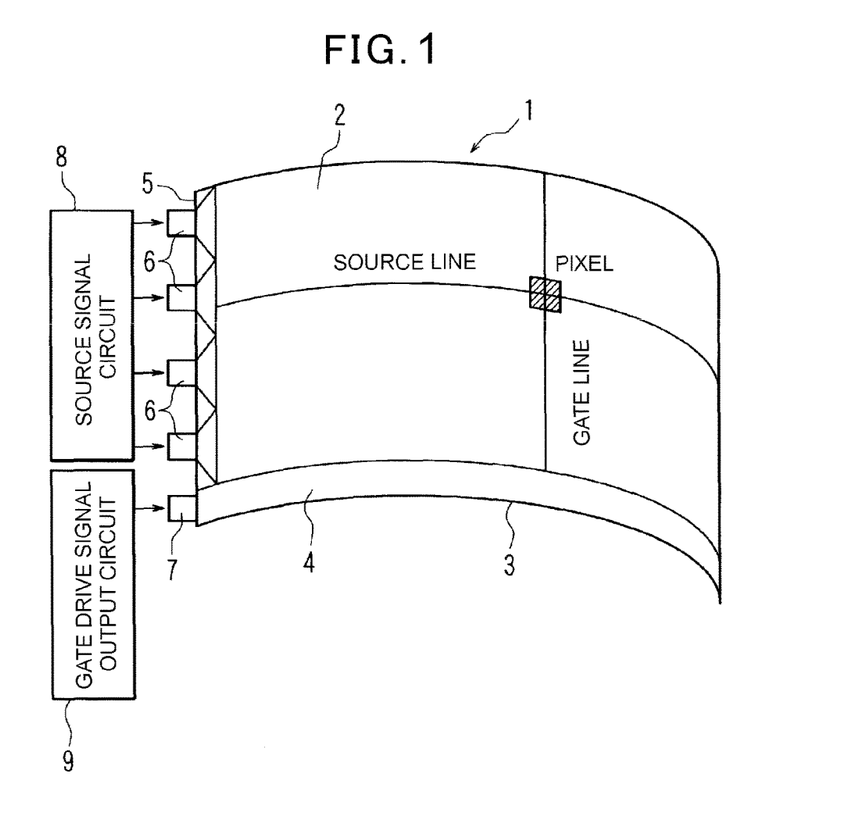
FIG. 1 shows a schematic outline view of a curved display apparatus according to an embodiment of the present invention.

FIG. 1 shows a schematic outline view of a curved display apparatus according to Embodiment 1 of the present invention.

In an exemplary embodiment shown in FIG. 1, a bendable display apparatus 1 includes pixels arranged in a matrix form on a bendable display screen 2 and a thin film transistor (TFT) 23 (FIG. 3) provided for each pixel.

A shift register 4 is provided along an edge (second edge) 3 of the display screen 2 in the row direction of the matrix form, which can be bent with a larger curvature (capable of being easily bent). The shift register 4 is a gate drive circuit to provide a gate signal for turning on the group of thin film transistors 23 (FIG. 3) disposed along the one line (gate line) in the column direction of the matrix form simultaneously, by each group sequentially in a first period. Namely, the shift register 4 outputs each data stored in respective bits to each of the gates.

A plurality of source drive circuits 6 are provided along an edge (first edge) 5 of the display screen 2 in the column direction of the matrix form, which can be bent with a smaller curvature. The source drive circuit 6 provides a pixel data signal to the sources in the group of thin film transistors 23 (FIG. 3) disposed along the one line (source line) in the row direction of the matrix form simultaneously, by each group sequentially in a second period, which is shorter than the first period. The each pixel data signal represents a gradation of each pixel for each of the transistors aligned in the row direction of the matrix.

A source signal circuit 8 to output a pixel data signal is connected to each of the source drive circuits 6, and each source drive circuit 6 provides the pixel data signal output from the source signal circuit 8 to the corresponding source line periodically.

An input terminal 7 of the shift register 4 is provided at an intersection of the edge 5 and the edge 3. A gate drive signal output circuit 9 is connected to the input terminal 7 to output a shift register drive signal for driving the shift register 4 (gate drive circuit) to turn on the gates in the group of thin film transistors 23 (FIG. 3) disposed along the gate line simultaneously, by each group sequentially in the first period.

It can be appreciated that the source signal circuit 8 and the gate drive signal output circuit 9 are formed on a portion of a bendable substrate close to the edge 5 which has a smaller curvature, not on the bendable display screen 2 with a large curvature.

In the presently illustrated embodiment, a source drive circuit 6, a shift register 4 and an input terminal 7 may be provided on a different substrate than the display screen 2 (which is, not formed monolithically).

Further, FIG. 1 shows an exemplary embodiment in which the surface of display screen 2 is protruding outwardly. However, the embodiments are not limited to any particular shape of the display screen 2. The surface of the display screen 2 may be formed in concave shape, or formed freely bendable either concavely or convexly. Further, in FIG. 1, the display screen 2 of square form is shown, but the shape of the display screen is not limited to a square form.

Figure 2:
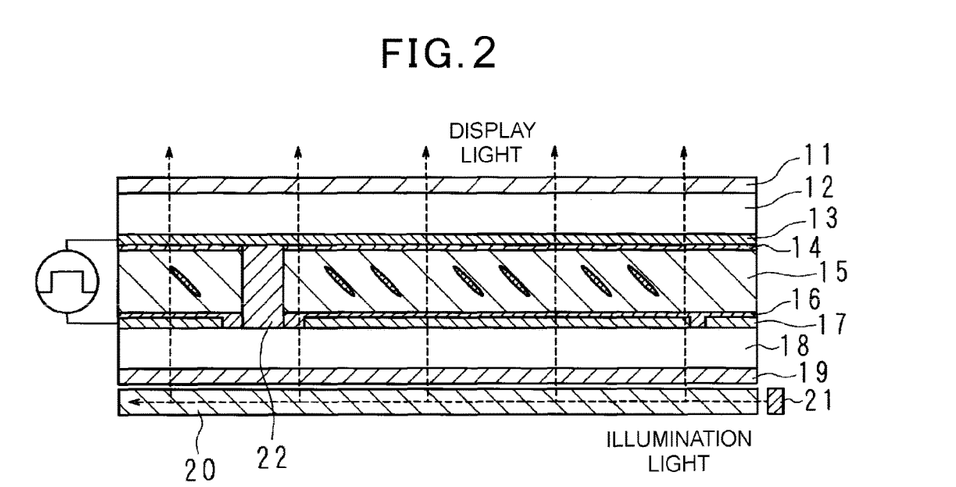
FIG. 2 shows a schematic cross-sectional view of a cross-section of a liquid crystal panel magnified in thickness direction, when the curved display apparatus according to an embodiment of the present invention is a liquid crystal display apparatus.

FIG. 2 shows a schematic cross-sectional view of a cross-section of a liquid crystal panel magnified in thickness direction, when the curved display apparatus according to an exemplary embodiment is a liquid crystal display apparatus.

In the presently illustrated embodiment, a liquid crystal panel includes two bendable transparent substrates 12, 18 with a liquid crystal layer 15 therebetween, and a plurality of spacers 22 is provided between the substrates 12 and 18 through the liquid crystal layer 15.

A transparent electrode 13 is provided on a surface of the substrate 12 facing toward the liquid crystal layer 15, and an alignment layer 14 is provided on a surface of a transparent electrode 13 facing toward the liquid crystal layer 15 so as to contact with the liquid crystal layer 15.

A pixel electrode 17 is provided on a surface of the substrate 18 facing toward the liquid crystal layer 15, and an alignment layer 16 is provided on a surface of a pixel electrode 17 facing toward the liquid crystal layer 15 so as to contact with the liquid crystal layer 15.

Polarizing plates 11 and 19 are each provided on the respective outer surface of the substrates 12 and 18, and a bendable light-guiding plate 20 and an LED (light-emitting diode) 21 as a light source of the light-guiding plate 20 are provided on the outer surface of the polarizing plate 19.

Figure 3:
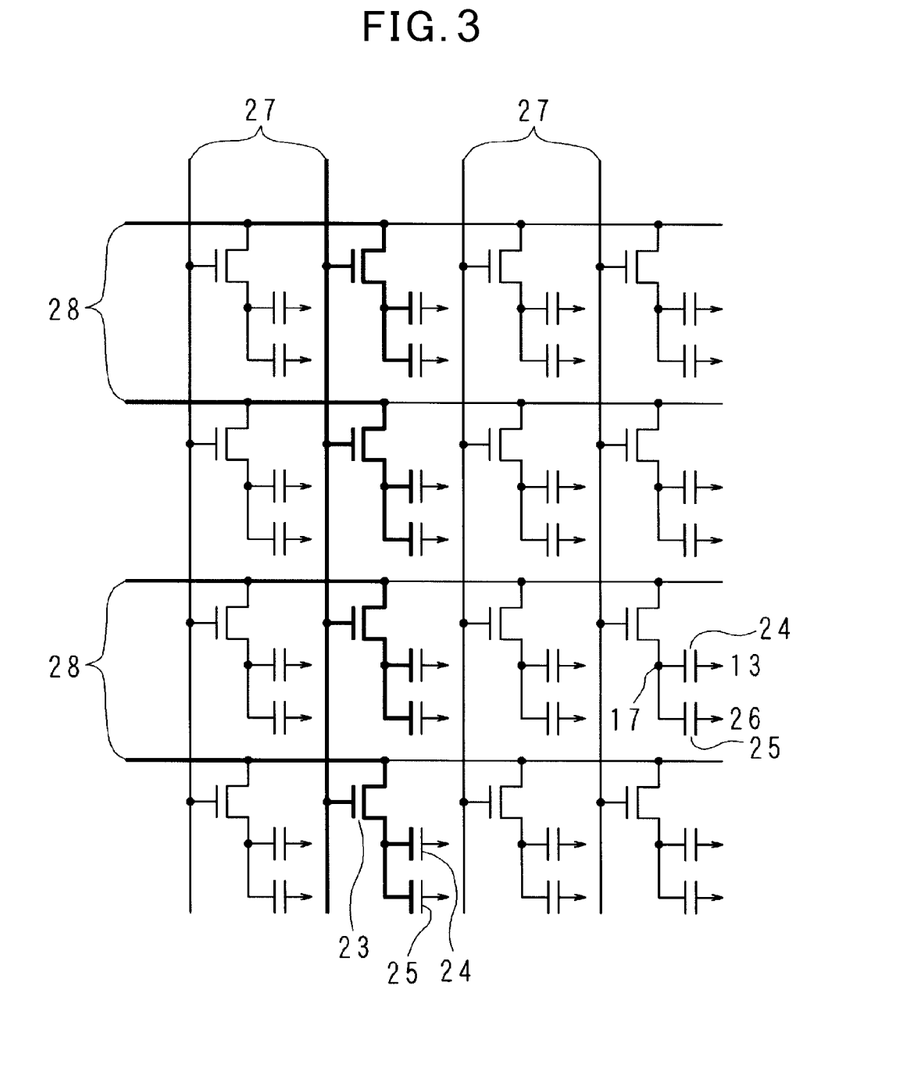
FIG. 3 shows an embodiment of circuit diagram of an equivalent circuit of pixel provided on respective pixels of the liquid crystal panel shown in FIG. 2.

FIG. 3 shows an embodiment of circuit diagram of an equivalent circuit of pixel provided on respective pixels of the liquid crystal panel shown in FIG. 2.

In the presently illustrated embodiment, the liquid crystal panel is of active matrix type, and includes a thin film transistor 23 for each pixel arranged in a matrix form, source lines 28 arranged side by side in the column direction of the matrix and each connected to the each corresponding source of the thin film transistors 23 aligned in the row direction of the matrix, and gate lines 27 arranged side by side in the row direction of the matrix and each connected to the each corresponding gate of the thin film transistors 23 aligned in the column direction of the matrix.

A pixel electrode 17 (FIG. 2) is connected to a drain of the thin film transistor 23, and further, a pixel capacitor 24 is formed between a pixel electrode 17 and a transparent electrode 13 (FIG. 2) that faces the pixel electrode 17 and an auxiliary capacitor 25 is formed between a pixel electrode 17 and a common electrode 26 that faces the pixel electrode 17. In the exemplary embodiment shown in FIG. 3, a voltage is being applied to the positions shown by bold lines.

At the pixels with such a configuration, when a voltage is applied to the gate line 27, all of the thin film transistors 23 of one column, which are connected to the gate line 27, are turned on, thereby allowing a current to flow between the source and the drain. This allows pixel data signal applied to the source line 28 to be applied to the pixel capacitor 24, the portion of the liquid crystal layer 15 with the pixel capacitor 24 to transmit display light depending on the applied pixel data signal, permitting the charge corresponding to the pixel data signal to accumulate on a capacitor 25.

After each pixel capacitor 24 and each auxiliary capacitor 25 in the selected column of the gate line 27 are charged up, a next column of gate lines 27 is selected by applying the voltage to the select gate line 27. The voltage of a low level is applied to the gate of the thin film transistors 23 in the previously selected column, turning the thin film transistors 23 in the previously selected column off. Although the pixel data signal from the source line 28 will no longer be applied to the pixel capacitor 24 in the previously selected column, a required voltage may be substantially maintained by the charge stored in the auxiliary capacitor 25 during a time period for displaying one frame until this gate line 27 is selected for the next time.

Figure 4:
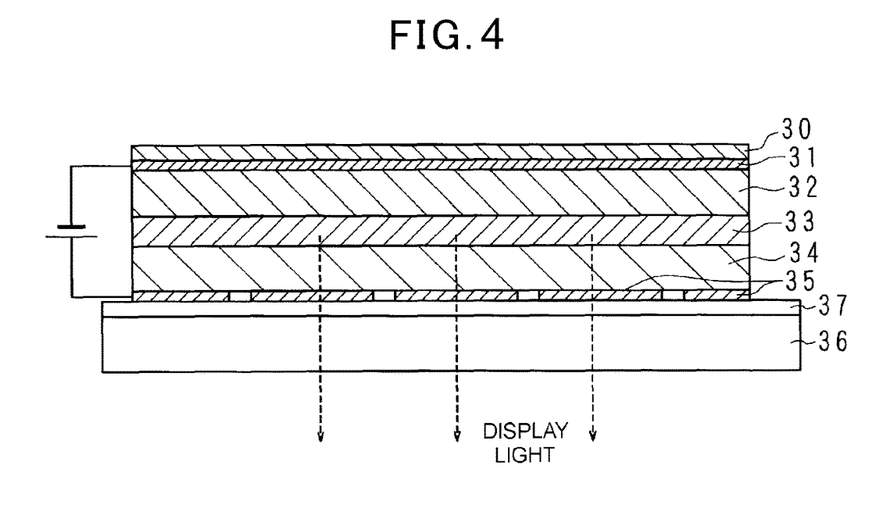
FIG. 4 shows a schematic cross-sectional view of a cross-section of an organic EL panel magnified in thickness direction, when the curved display apparatus according to an embodiment of the present invention is an organic EL display apparatus.

FIG. 4 shows a schematic cross-sectional view of a cross-section of an organic EL panel magnified in thickness direction, when the curved display apparatus according to an embodiment of the present invention is an organic EL (electro Luminescence) display apparatus.

In the presently illustrated embodiment, the organic EL panel includes an organic semiconductor layer, and an anode 35 and a cathode 31 for each pixel with the organic semiconductor layer therebetween, on a bendable transparent substrate 36. The organic semiconductor layer includes a light emission layer 33, and a hole transport layer 34 and an electron transport layer 32 with the light emission layer 33 therebetween.

A gas barrier film 37 is formed between the substrate 36 and the anode 35 to prevent water and oxygen to enter the organic semiconductor layer, enabling to prevent the deterioration of the organic semiconductor layer. A sealing film 30 is also formed outside the cathode 31 to prevent water and oxygen to enter the organic semiconductor layer.

In the organic EL panel with such a configuration, electrons and holes injected from the cathode 31 and the anode 35, respectively, migrate through the electron transport layer 32 for the cathode 31 and the hole transport layer 34 for the anode 35, respectively, and recombine in the light emission layer 33, which produces an emission of light.

Electrons and holes injected from the cathode 31 and the anode 35, respectively, may increase or decrease depending on the applied pixel data signal, resulting in an increase or decrease in the intensity of the light emitted from the light emission layer 33. The pixel data signal to be applied between the cathode 31 and the anode 35 is provided by a pixel similar to the pixel shown in FIG. 3.

In the presently illustrated embodiment of a display apparatus 1, the shift register 4 is provided along an edge 3, which is the edge capable of being easily bent, of the display panel 2 to turn the each gate of thin film transistor 23 on sequentially in the first period. Further, a plurality of the source drive circuits 6 are provided along a less easily bendable edge 5 to provide a pixel data signal to each source of thin film transistor 23 sequentially in the second period, which is shorter than the first period.

This configuration allows to provide the shift register 4, which has a simple circuit configuration thereby can be formed in easily bendable form, on the easily bendable edge 3, as well as to provide the source drive circuit 6, which has more complicated circuit configuration thereby is hardly formed in bendable form, on the less easily bendable edge 5. This can make possible to prevent an occurrence of a defective mounting such as peeling of a source drive circuit.

Further, in the presently illustrated embodiment, a curvature of a mounting part of the source drive circuit 6 can be minimized, thereby any redundancy to compensate curvature is not required for COF (chip on film) and also there is no need to form the source drive circuit 6 in bendable form. Furthermore, the gate drive signal output circuit 9 needs not be mounted on the easily bendable edge 3, this makes possible to realize a display apparatus that is capable of being bent more easily.

Embodiment 2

Figure 5:
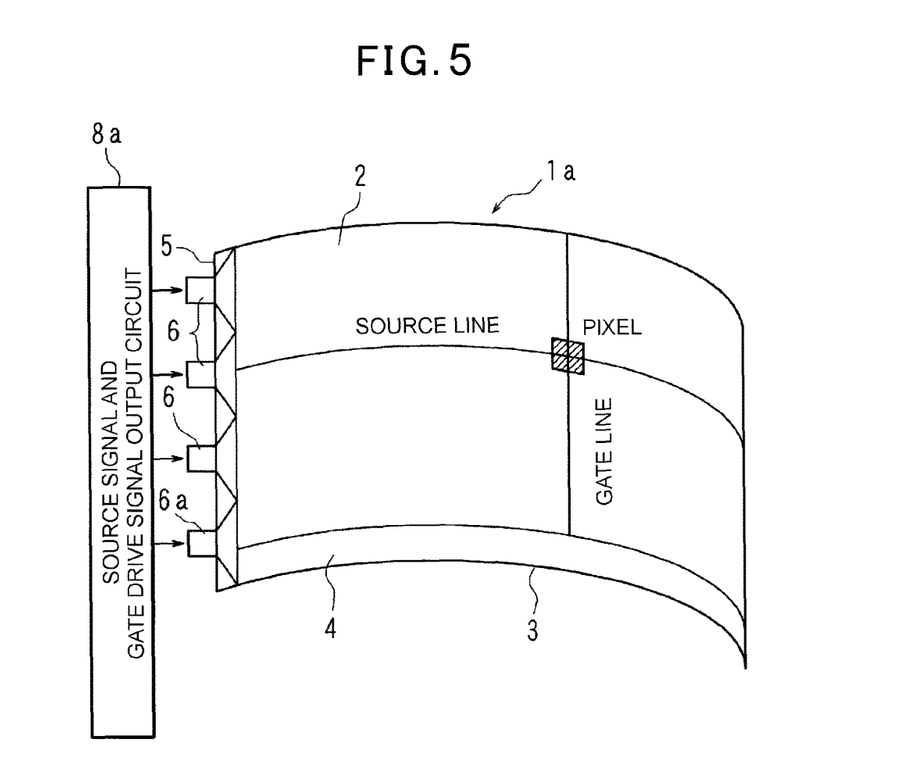
FIG. 5 shows a schematic outline view of a curved display apparatus according to an embodiment of the present invention.

FIG. 5 shows a schematic outline view of a curved display apparatus according to Embodiment 2 of the present invention.

In the presently illustrated embodiment, the bendable display apparatus 1a includes pixels arranged in a matrix form on a bendable display screen 2.

To each source drive circuit 6 is connected a source signal and gate drive signal output circuit 8a which outputs a pixel data signal and also a shift register drive signal. The source signal and gate drive signal output circuit 8a is configured such that the source signal circuit 8 and the gate drive signal output circuit 9 shown in FIG. 1 are integrated in one package.

The shift register drive signal, other than the pixel data signal is provided from the source signal and gate drive signal output circuit 8a to the source drive circuit 6a closest to the shift register 4 among a plurality of the source drive circuits 6a. The pixel data signal is provided from the source signal and gate drive signal output circuit 8a to the source drive circuit 6.

This configuration makes it possible to eliminate the gate drive signal output circuit 9, suppressing the occurrence of defects by reducing the number of components as well as reducing component cost. Since the other configurations, operation and action of the curved display apparatus according to Embodiment 2 are similar to those of the curved display apparatus according to Embodiment 1, they will not be described.

Embodiment 3

Figure 6:
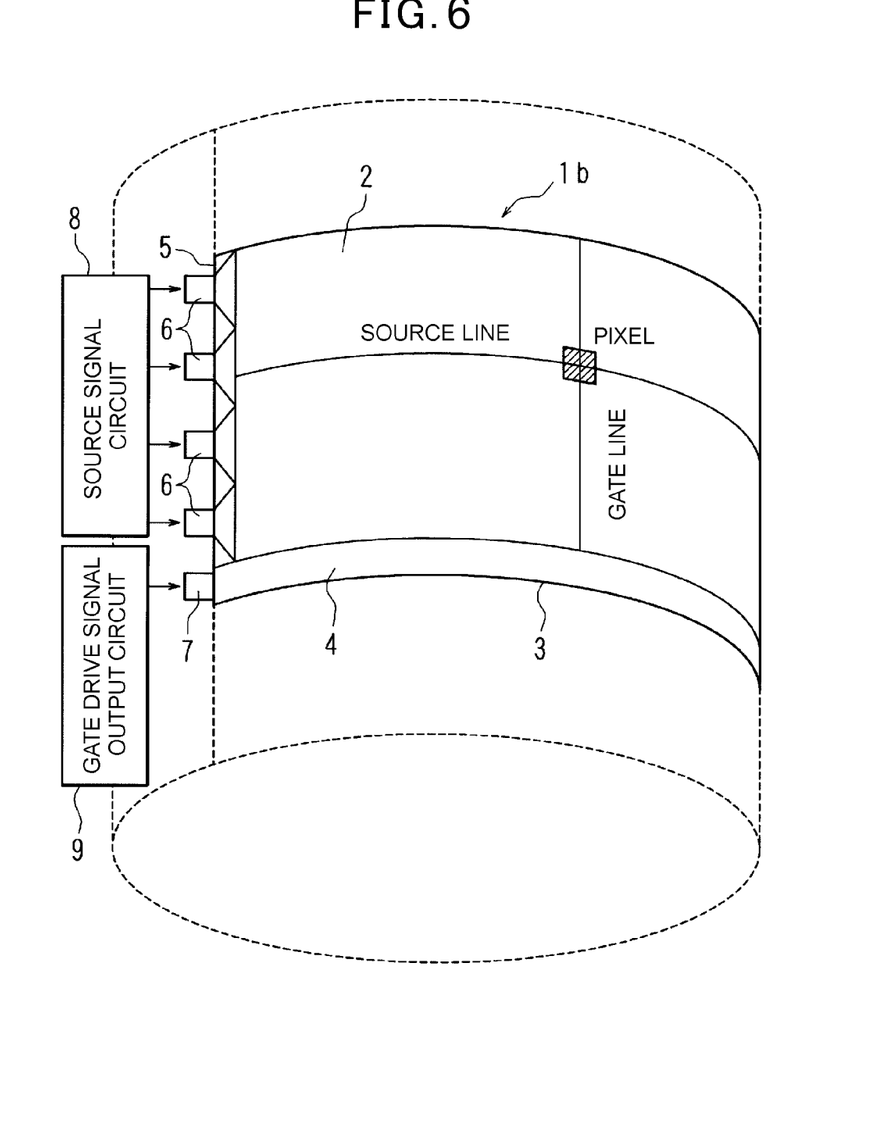
FIG. 6 shows a schematic outline view of a curved display apparatus according to an embodiment of the present invention.

FIG. 6 shows a schematic outline view of a curved display apparatus according to Embodiment 3 of the present invention.

In the presently illustrated embodiment, the bendable display apparatus 1b is configured such that the bendable display screen 2 is a part of a side of a cylindrical body. The side is parallel with a height direction of the cylindrical body.

The edge 5, on which each source drive circuit 6 and the input terminal 7 of the shift register 4 are mounted, corresponds to the height direction of the cylindrical body.

This configuration enables to form the edge 5 into flat surface in the height direction of the cylindrical body, therefore, the maximum effect, which is described in Embodiment 1, is obtained easily.

The cross-section of the cylindrical body is not limited to a true circle, and may be an oval or a cross-section of the cylindrical body whose curvature is changing along the circumferential direction. Since the other configurations, operation and action of the curved display apparatus according to Embodiment 3 are similar to those of the curved display apparatus according to Embodiments 1 and 2, they will not be described.

Embodiment 4

Figure 7:
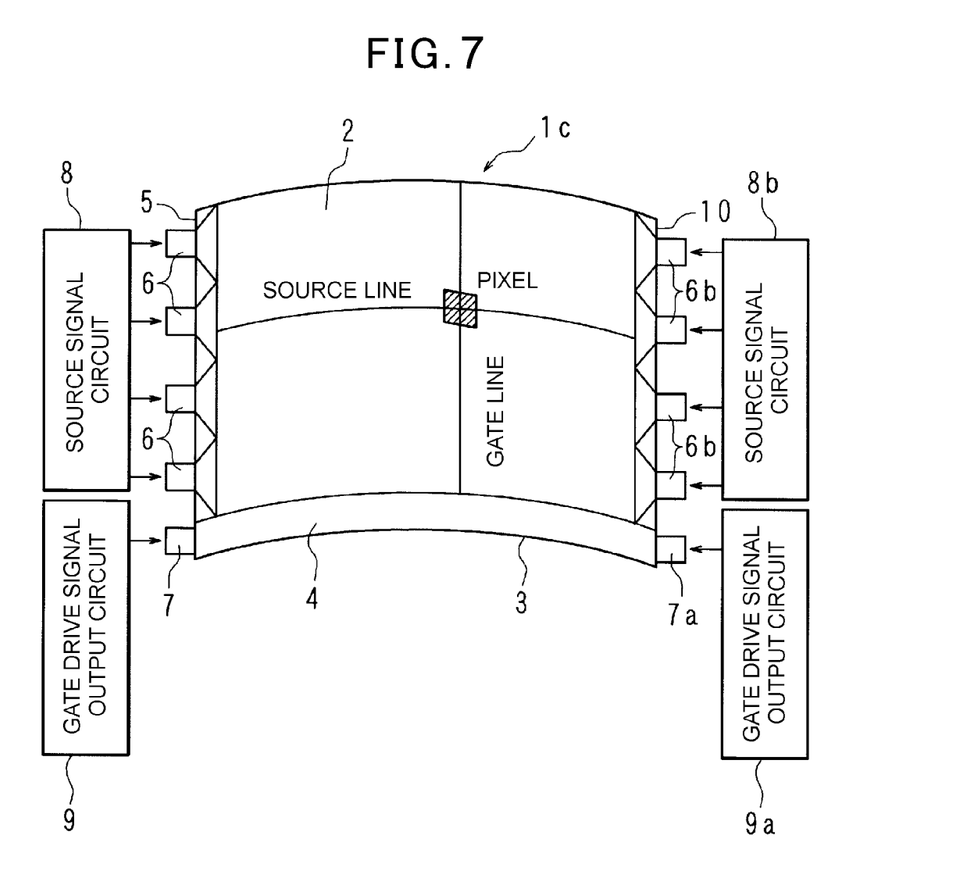
FIG. 7 shows a schematic outline view of a curved display apparatus according to an embodiment of the present invention.

FIG. 7 shows a schematic outline view of a curved display apparatus according to Embodiment 4 of the present invention.

In the presently illustrated embodiment, the bendable display apparatus 1c includes a plurality of source drive circuits 6 on an edge 5, to each of which a source signal circuit 8 is connected, and a plurality of source drive circuits 6b on an edge 10 (third edge) opposed to the edge 5, to each of which a source signal circuit 8b is connected. Similar to the source drive circuit 6, each source drive circuit 6b provides the pixel data signal output from the source signal circuit 8b to the corresponding source line periodically. It should be noted that in this exemplary embodiment, the curvature of the edge 10 is small similar to that of the edge 5.

An input terminal 7 of a shift register 4 is provided on the edge 5, and a gate drive signal output circuit 9 is connected to the input terminal 7. Further, the other input terminal 7a of the shift register 4 is provided on the edge 10 opposed to the edge 5, and a gate drive signal output circuit 9a is connected to the input terminal 7a. Similar to the gate drive signal output circuit 9, the gate drive signal output circuit 9a outputs a shift register drive signal. For the source drive circuit 6, the source signal circuit 8, the source drive circuit 6b, the source signal circuit 8b, the input terminal 7, the gate drive signal output circuit 9, the input terminal 7a, and the gate drive signal output circuit 9a, one or more may be integrated or eliminated adequately, as shown in Embodiment 2.

This configuration enables to reduce the driving area of the source drive circuits 6 and the source drive circuits 6b by half, thereby an increasement in size and high definition can be achieved for the display screen 2. Further, since the signals are inputted to the same source line from both sides in this exemplary embodiment, even if a source line disconnection occurs by, for example, a crack due to bending, signals will be inputted from both sides of the disconnected part, which can prevent to cause a line defect so that the display is maintained, improving reliability of a display apparatus. Since the other configurations, operation and action of the curved display apparatus according to Embodiment 4 are similar to those of the curved display apparatus according to Embodiments 1 to 3, they will not be described.

Embodiment 5

Figure 8:
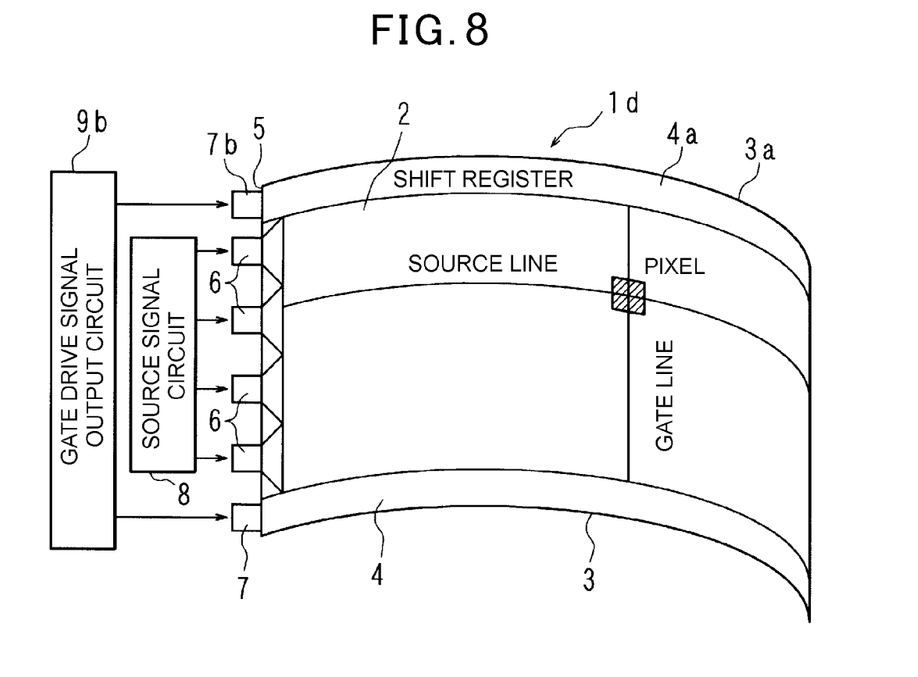
FIG. 8 shows a schematic outline view of a curved display apparatus according to an embodiment of the present invention.

FIG. 8 shows a schematic outline view of a curved display apparatus according to Embodiment 5 of the present invention.

In the presently illustrated embodiment, the bendable display apparatus 1d includes a shift register 4 on an edge 3 and an input terminal 7 of the shift register 4 on an edge 5, and a shift register 4a on an edge 3a (fourth edge) opposed to the edge 3 and an input terminal 7b of the shift register 4a on the edge 5. A gate drive signal output circuit 9b to output a shift register drive signal is connected to the input terminal 7 and the input terminal 7b. It should be noted that in this exemplary embodiment, the curvature of the edge 3a is large similar to that of edge 3.

This configuration enables to reduce the driving area of the shift register 4 and the shift register 4a by half, thereby an increasement in size and high definition can be achieved for the display screen 2. Further, since the signals are inputted to the same gate line from both sides in this exemplary embodiment, even if a gate line disconnection occurs by, for example, a crack due to bending, signals will be inputted from both sides of the disconnected part, which can prevent to cause a line defect so that the display is maintained, improving reliability of a display apparatus.

The shift register 4 and the shift register 4a may be configured not to be connected to the same gate line, but to be connected to the gate lines on the display screen 2 each allotted for the shift register 4 and the shift register 4a. Such a configuration of the display apparatus may not provide the effect of preventing a line defect caused by the disconnection of a gate line, as described above, however, this configuration enables to reduce each load on the shift register 4 and the shift register 4a, thereby an increasement in size and high definition can be achieved for the display screen 2.

Since the other configurations, operation and action of the curved display apparatus according to Embodiment 5 are similar to those of the curved display apparatus according to Embodiments 1 to 4, they will not be described.

Embodiment 6

Figure 9:
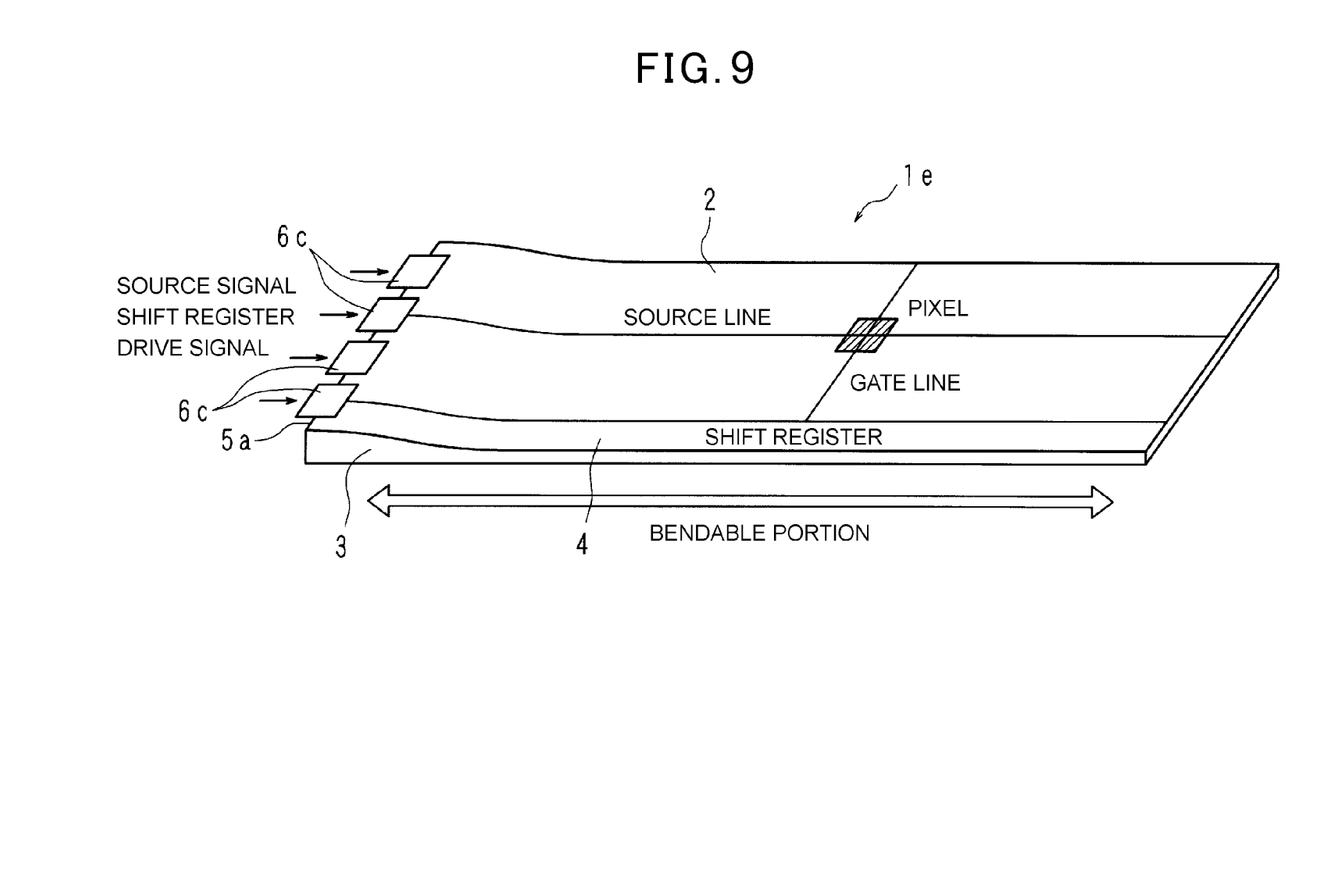
FIG. 9 shows a schematic outline view of a curved display apparatus according to an embodiment of the present invention.

FIG. 9 shows a schematic outline view of a curved display apparatus according to Embodiment 6 of the present invention.

The bendable display apparatus 1e of the presently illustrated embodiment is shown in a state of being planarly developed, not in a bended state as shown for the display apparatus 1, and 1a to 1d of Embodiments 1 to 5.

The display apparatus 1e of this exemplary embodiment is formed to have a bendable portion of a substrate of the display screen 2, which is thinner than the vicinity of each edge (first edge) 5, 5a and 10 of the display screen 2, to which the source drive circuits 6, 6c and the input terminals 7, 7a are mounted.

In this embodiment 6, only the portion of the display screen to be bent and not to be close to the edges 5, 5a and 10 which have a small curvature shown in Embodiments 1 to 5 is formed thin, and the source drive circuits 6, 6c, the input terminals 7, 7a and the like are mounted on the edges 5, 5a, 10 with a small curvature, while the shift registers 4, 4a are mounted on the edges 3, 3a which have a large curvature.

This makes it possible to realize a bendable display apparatus with a larger curvature without decreasing a production yield. Since the other configurations, operation and action of the curved display apparatus according to Embodiment 6 are similar to those of the curved display apparatus according to Embodiments 1 to 5, they will not be described.

It should be appreciated that the disclosed Embodiments 1 to 6 are intended to be illustrative and not restrictive in all respects. The scope of the present invention is not limited to the above-described context, and is defined by the claims, and the meaning equivalent to the claims and all modifications within the scope of the claims are intended to be included. In addition, various specific technical features described in the above embodiments can be combined in any suitable manner without contradiction.

The curved display apparatus according to the embodiments of the present invention can be used on display apparatus having a bendable display screen (flexible display) such as a liquid crystal display apparatus, an organic EL display apparatus and an electrophoresis display apparatus.

What is claimed is:

1. A curved display apparatus with transistors of respective pixels arranged in a matrix form on a bendable display screen, the apparatus comprising:
a plurality of gate lines arranged side by side in a row direction of the matrix and each connected to each gate of a plurality of transistors aligned in a column direction of the matrix,
a plurality of source lines arranged side by side in the column direction of the matrix and each connected to each source of a plurality of transistors aligned in the row direction of the matrix,
a gate drive signal output circuit to provide a drive signal;
a gate drive circuit receptive of the drive signal to sequentially provide a gate signal for simultaneously turning on each of the plurality of transistors aligned in the column direction of the matrix to the plurality of gate lines,
a source drive circuit to provide a pixel data signal to each of the plurality of source lines, the each pixel data signal representing a gradation of a pixel for each of the plurality of transistors aligned in the row direction of the matrix, and
a source signal circuit to provide the pixel data signal to the source drive circuit,
wherein the source signal circuit and the gate drive signal output circuit are provided along a first bendable edge of the display screen, the first bendable edge having a first curvature, and the gate drive circuit is provided along a second bendable edge at the bottom or top of the display screen, the second bendable edge having a second curvature larger than the first curvature.

2. The curved display apparatus of claim 1, wherein the gate drive circuit is a shift register to output each data stored in respective bits to each gate line, and
the drive signal is a shift register drive signal for driving the shift register.

3. The curved display apparatus of claim 1, wherein the curved display apparatus is configured so that the source signal circuit and the gate drive signal output circuit are integrated into a source signal and gate drive signal output circuit, and the drive signal output from the source signal and gate drive signal output circuit is provided to the gate drive circuit through the source drive circuit.

4. The curved display apparatus of claim 1, wherein the display screen is formed so as to be a part of a side of a cylindrical body, the side being parallel with a height direction of the cylindrical body, and
the first bendable edge of the display screen with the first curvature extends along the height direction of the cylindrical body, and the second bendable edge of the display screen with the second curvature extends along a circumferential direction of the cylindrical body.

5. The curved display apparatus of claim 1, wherein the source drive circuits are provided on the first bendable edge with the first curvature and a third edge opposed to the first bendable edge, and the gate drive signal output circuit and the source signal circuit are provided close to the first bendable edge with the first curvature and the third edge opposed to the first bendable edge.

6. The curved display apparatus of claim 1,
wherein the gate drive circuits are provided on the second bendable edge with the second curvature and a fourth edge opposed to the second bendable edge, and each of the gate drive circuits provided on the second bendable edge and the fourth edge opposed to the second bendable edge is configured so that to which the drive signal output from the gate drive signal output circuit is provided.

7. The curved display apparatus of claim 1, wherein a portion of the display screen capable of being bent with the second curvature is formed thinner than a portion of the display screen capable of being bent with the first curvature.

8. A curved display apparatus with transistors of respective pixels arranged in a matrix form on a bendable display screen, the apparatus comprising:
a plurality of gate lines arranged side by side in a row direction of the matrix and each connected to each gate of a plurality of transistors aligned in a column direction of the matrix,
a plurality of source lines arranged side by side in the column direction of the matrix and each connected to each source of a plurality of transistors aligned in the row direction of the matrix,
a gate drive signal output circuit to provide a drive signal;

a gate drive circuit receptive of the drive signal to sequentially provide a gate signal for simultaneously turning on each of the plurality of transistors aligned in the column direction of the matrix to the plurality of gate lines, a source drive circuit to provide a pixel data signal to each of the plurality of source lines, the each pixel data signal representing a gradation of a pixel for each of the plurality of transistors aligned in the row direction of the matrix, and a source signal circuit to provide the pixel data signal to the source drive circuit, wherein the source signal circuit and the gate drive signal output circuit are provided along a first bendable edge of the display screen, the first bendable edge having a first curvature, and the gate drive circuit is provided along a second bendable edge of the display screen, the first bendable edge intersecting with the second bendable edge, the second bendable edge having a second curvature larger than the first curvature.

9. The curved display apparatus of claim 8, wherein the gate drive circuit is a shift register to output each data stored in respective bits to each gate line, and the drive signal is a shift register drive signal for driving the shift register.

10. The curved display apparatus of claim 8, wherein the curved display apparatus is configured so that the source signal circuit and the gate drive signal output circuit are integrated into a source signal and gate drive signal output circuit, and the drive signal output from the source signal and gate drive signal output circuit is provided to the gate drive circuit through the source drive circuit.

11. The curved display apparatus of claim 8, wherein the display screen is formed so as to be a part of a side of a cylindrical body, the side being parallel with a height direction of the cylindrical body, and the first bendable edge of the display screen with the first curvature extends along the height direction of the cylindrical body, and the second bendable edge of the display screen with the second curvature extends along a circumferential direction of the cylindrical body.

12. The curved display apparatus of claim 8, wherein the source drive circuits are provided on the first bendable edge with the first curvature and a third edge opposed to the first bendable edge, and the gate drive signal output circuit and the source signal circuit are provided close to the first bendable edge with the first curvature and the third edge opposed to the first bendable edge.

13. The curved display apparatus of claim 8, wherein the gate drive circuits are provided on the second bendable edge with the second curvature and a fourth edge opposed to the second bendable edge, and each of the gate drive circuits provided on the second bendable edge and the fourth edge opposed to the second bendable edge is configured so that to which the drive signal output from the gate drive signal output circuit is provided.

14. The curved display apparatus of claim 8, wherein a portion of the display screen capable of being bent with the second curvature is formed thinner than a portion of the display screen capable of being bent with the first curvature.

* * * * *